United States Patent
Morita et al.

(10) Patent No.: US 10,897,243 B2
(45) Date of Patent: Jan. 19, 2021

(54) CABLE AND CONNECTION DEVICE

(71) Applicant: SONY CORPORATION, Tokyo (JP)

(72) Inventors: Hiroshi Morita, Kanagawa (JP); Kazuaki Toba, Kanagawa (JP); Kazuo Yamamoto, Chiba (JP); Masanari Yamamoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/640,922

(22) PCT Filed: Aug. 27, 2018

(86) PCT No.: PCT/JP2018/031608
§ 371 (c)(1),
(2) Date: Feb. 21, 2020

(87) PCT Pub. No.: WO2019/044778
PCT Pub. Date: Mar. 7, 2019

(65) Prior Publication Data
US 2020/0212898 A1 Jul. 2, 2020

(30) Foreign Application Priority Data

Sep. 1, 2017 (JP) ................... 2017-169021

(51) Int. Cl.
*H01P 1/00* (2006.01)
*H03K 5/01* (2006.01)

(52) U.S. Cl.
CPC ............ *H03K 5/01* (2013.01); *H01P 1/00* (2013.01)

(58) Field of Classification Search
CPC ......... H03K 5/01; H01P 1/00; G06F 13/4022; G06F 13/4081; G09G 2370/12
See application file for complete search history.

(56) References Cited

U.S. PATENT DOCUMENTS

| | | | |
|---|---|---|---|
| 2009/0153467 A1* | 6/2009 | Crovella | G09G 5/006 345/156 |
| 2012/0229706 A1 | 9/2012 | Kabuto | |
| 2014/0327833 A1 | 11/2014 | Kabuto | |

FOREIGN PATENT DOCUMENTS

| | | |
|---|---|---|
| CN | 102740034 A | 10/2012 |
| CN | 104054037 A | 9/2014 |
| JP | 2012-191282 A | 10/2012 |
| JP | 2015-111418 A | 6/2015 |
| WO | 2013/088480 A1 | 6/2013 |

OTHER PUBLICATIONS

International Search Report and Written Opinion of PCT Application No. PCT/JP2018/031608, dated Nov. 6, 2018, 07 pages of ISRWO.

* cited by examiner

Primary Examiner — Jung Kim
(74) Attorney, Agent, or Firm — Chip Law Group

(57) ABSTRACT

A transmission device is enabled to satisfactorily detecting whether or not a reception device is in the operating state even in a case where an element that adjusts signal quality is interposed in a data line. A cable is connected between the transmission device and the reception device. The element that adjusts signal quality is interposed in the data line. A detection unit detects that the reception device is in the operating state. An information supply unit supplies detection information to the transmission device through a predetermined line.

10 Claims, 15 Drawing Sheets

CABLE AND CONNECTION DEVICE

CROSS REFERENCE TO RELATED APPLICATIONS

This application is a U.S. National Phase of International Patent Application No. PCT/JP2018/031608 filed on Aug. 27, 2018, which claims priority benefit of Japanese Patent Application No. JP 2017-169021 filed in the Japan Patent Office on Sep. 1, 2017. Each of the above-referenced applications is hereby incorporated herein by reference in its entirety.

TECHNICAL FIELD

The present technology relates to a cable and a connection device, and more particularly, to a cable and a connection device in which an element that adjusts signal quality is interposed in a data line.

BACKGROUND ART

In recent years, High Definition Multimedia Interface (HDMI) or the like has been used as a digital interface for connecting consumer electronics (CE) devices to each other. For example, Patent Document 1 describes the HDMI standard. In the HDMI standard, digital signals such as video, audio, and control are transmitted using a Transition Minimized Differential Signaling (TMDS) channel. Note that, "HDMI" is a registered trademark.

CITATION LIST

Patent Document

Patent Document 1: Japanese Patent Application Laid-Open No. 2015-111418

SUMMARY OF THE INVENTION

Problems to be Solved by the Invention

For example, in a case where HDMI is used as a digital interface, a source device such as a Blu-ray Disc (BD) player and a sink device such as a television (TV) receiver are connected to each other by an HDMI cable. In the HDMI cable, assigned lines are: four high-speed signal lines including a clock line; a +5 V power line; a Display Data Channel (DDC) line; a Consumer Electronics Control (CEC) line; a Hot Plug Detect (HPD) line; a Utility line; and the like. In the high-speed signal line, digital signals such as video, audio, and control are transmitted as TMDS data. In this case, a current drive type is used that transmits data "0" and "1" by drawing a current by the source side from a termination resistor of 50Ω connected to 3.3 V on the sink side. Note that, "Blu-ray" is a registered trademark.

In the HDMI standard, a sequence at connection of the HDMI cable is defined, and when both plugs of the cable are respectively connected to the source device and the sink device, a voltage of 5 V is transmitted from the source device to the sink device via the +5 V power line, and when 5 V is detected in the sink device, 5 V is transmitted from the sink device to the source device via the HPD line, whereby the source device is informed that the cable is correctly connected.

When detecting 5 V of the HPD line, the source device determines that the cable is connected, and reads Extended Display Identification Data (EDID) on the sink device side by using the DDC line. Thus, detection of 5 V on the HPD line become a starting point for communication for the source device. However, in this sequence, it is only detected that the cable is connected to the source device and the sink device, and the source device does not detect whether or not the sink device has entered the operating state.

In the source device, although not defined in the specification, a function called Rx sense is often used. The Rx sense is a method in which the source device detects whether or not the sink device is in the operating state. As described above, in the HDMI connection sequence, the operating state of the sink device is not detected. Therefore, in a case where it is desired to start communication after detecting whether or not the sink device is in the operating state, it is necessary to implement the Rx sense.

In a case where the normal HDMI cable is connected, for example, when the operating state is a state in which 3.3 V of the TMDS line in the sink device has risen, the source device monitors the voltage of the TMDS line to determine whether or not 3.3 V in the sink device has risen, thereby being able to recognize the operating state of the sink device. However, in a case where an active optical cable (AOC) is connected, the above-described Rx sense operation cannot be realized.

In the case of the AOC, circuits for converting electricity into light and light into electricity are required at both plugs of the cable. In the case of HDMI, the circuit is generally driven using the power of the +5 V power line, and for example, if 3.3 V is generated from the +5 V power line with a low drop out (LDO) regulator or the like, the source device detects 3.3 V generated in a source side plug. That is, the source device misunderstands that the sink device is in the operating state when the source side plug is connected to the source device. This is similar even in a case where an active copper cable (ACC) is connected.

An object of the present technology is to enable a transmission device to satisfactorily detect whether or not a reception device is in the operating state even in a case where an element that adjusts signal quality is interposed in a data line.

Solutions to Problems

A concept of the present technology is in
a cable connected between a transmission device and a reception device,
the cable including:
an element that adjusts signal quality, interposed in a data line;
a detection unit that detects that the reception device is in an operating state; and
an information supply unit that supplies the detection information to the transmission device through a predetermined line.

The cable in the present technology is connected between the transmission device and the reception device, and the element that adjusts signal quality is interposed in the data line. The detection unit detects that the reception device is in the operating state. For example, the detection unit may determine that the reception device is in the operating state when a predetermined voltage is applied to the data line on the reception device's side.

The information supply unit supplies the detection information to the transmission device through the predetermined line. For example, the information supply unit may output, to a line through which a communication permission signal is supplied to the transmission device, the communication permission signal in response to the detection information. In this case, the transmission device can recognize that the reception device is in the operating state when the communication permission signal is output to the line through which the communication permission signal is supplied. In this case, for example, the line through which the communication permission signal is supplied to the transmission device may be an HPD line. Then, in this case, for example, the information supply unit may change a switch provided on the HPD line from off (open) to on (closed) in response to the detection information.

In this case, for example, a data application unit may be further included that applies a predetermined voltage to a data line on the transmission device's side. Therefore, it is possible to cope with a source device in which a condition that the reception device is in the operating state is that the predetermined voltage is applied to the data line. In this case, for example, the data application unit may be controlled to apply the predetermined voltage to the data line on the transmission device's side in response to the detection information. In this case, current consumption in the cable can be reduced.

Furthermore, for example, the information supply unit may apply a predetermined voltage to a data line on the transmission device's side in response to the detection information. In this case, for example, the detection information from the detection unit may be sent to the information supply unit through a predetermined line. In this case, the transmission device can recognize that the reception device is in the operating state when the predetermined voltage is applied to the data line on the transmission device's side.

As described above, in the present technology, it is detected that the reception device is in the operating state, and the detection information is supplied to the transmission device through the predetermined line. Therefore, the transmission device can satisfactorily detect whether or not the reception device is in the operating state even in a case where the element that adjusts signal quality is interposed in the data line.

Effects of the Invention

According to the present technology, the transmission device can satisfactorily detect whether or not the reception device is in the operating state even in the case where the element that adjusts signal quality is interposed in the data line. Note that, the advantageous effects described in this specification are merely examples, and the advantageous effects of the present technology are not limited to them and may include additional effects.

MODE FOR CARRYING OUT THE INVENTION

The following is a description of a mode for carrying out the invention (the mode will be hereinafter referred to as the "embodiment"). Note that, explanation will be made in the following order.

1. Embodiment
2. Modifications
<1. Embodiment>
[Configuration of Transmission System]

Figure 1:
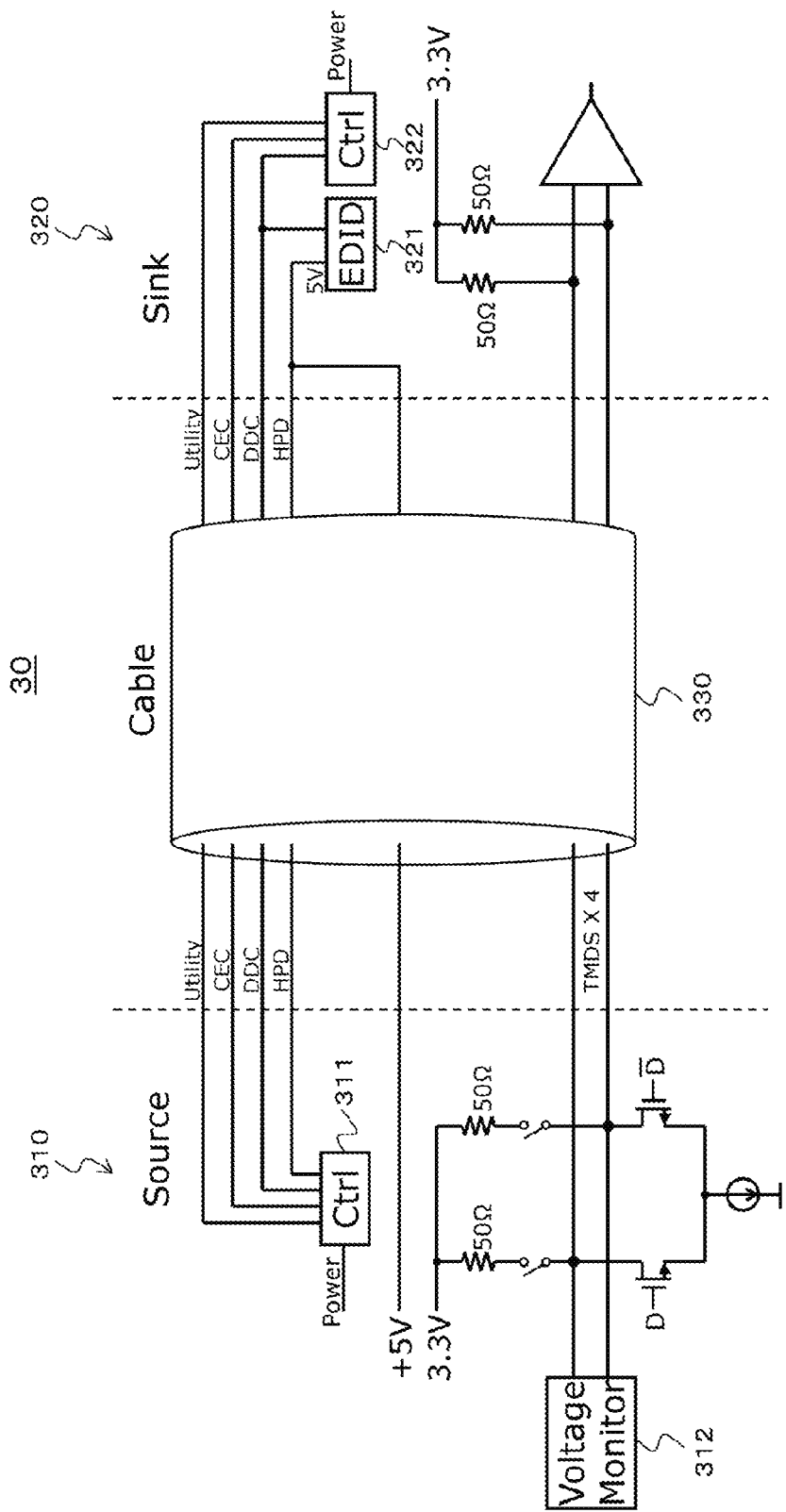
FIG. 1 is a diagram illustrating a configuration example of a transmission system using HDMI as a digital interface.

FIG. 1 illustrates a configuration example of a transmission system 30. The transmission system 30 is an HDMI transmission system using HDMI as a digital interface. The transmission system 30 includes a source device 310 that is an HDM transmitter, a sink device 320 that is an HDMI receiver, and an HDMI cable 330 that connects them to each other.

Transmission channels of the transmission system 30 include three TMDS channels that transmit, as digital data, signals of video, audio, and control as TMDS data, and one TMDS clock channel that transmits a clock signal. Each of the TMDS channels and the TMDS clock channel includes two differential signal lines. In the illustrated example, only one channel is illustrated.

Furthermore, there are a DDC line, a CEC line, an HPD line, a Utility line, and a +5 V power line as control signal lanes for an HDMI system. The DDC line includes two signal lines, an SDA line and an SCL line included in the HDMI cable 330. The DDC line is used, for example, for the source device 310 to read the EDID from the sink device 320. The CEC line is used to perform bidirectional communication of control data between the source device 310 and the sink device 320.

In the TMDS channel, a current drive type is used that transmits data "0" and "1" by drawing a current from a termination resistor of 50Ω connected to the sink device 320 side to the source device 310 side. At this time, a signal is transmitted differentially on the basis of differential signals of D and D (bar). Note that, in the illustrated example, a termination resistor of 50Ω on the source device 310 side is used; however, in TMDS, without using this 50Ω, driving is also possible by only the termination resistor of 50Ω on the sink device side.

In the HDMI standard, a sequence at connection of the HDMI cable 330 is defined, and when both plugs of the HDMI cable 330 are respectively connected to the source device 310 and the sink device 320, a voltage of 5 V is transmitted from the source device 310 to the sink device 320 via the +5 V power line, and when 5 V is detected in the sink device 320, 5 V is transmitted from the sink device 320 to the source device 310 via the HPD line, whereby the source device 310 is informed that the cable is correctly connected.

When detecting 5 V of the HPD line, a control unit 311 of the source device 310 determines that the cable 330 is connected between the source device 310 and the sink device 320, and reads the EDID in an EDID ROM 321 on the sink device 320 side by using the DDC line. Thereafter, using a control line such as the DDC line, exchange of signals such as HDCP is started between the source device 310 and the sink device 320, and transmission of TMDS data by using the TMDS channel is started in one direction from the source device 310 to the sink device 320. Thus, detection of 5 V on the HPD line becomes a starting point of communication, for the source device 310. However, in this sequence, it is only detected that the source device 310 is connected to the sink device 320 via the HDMI cable 330, and the source device 310 does not detect whether or not the sink device 320 has entered the normal operating state. Note that, the source device 310 and the sink device 320 can exchange information by using a register prepared in a control unit 322 on the sink device 320 side.

In the source device 310, although not defined in the specification, a function called Rx sense is often used. The Rx sense is a method in which the source device 310 detects whether or not the sink device 320 is in the operating state. As described above, in the HDMI connection sequence, the operating state of the sink device 320 is not detected. Therefore, in a case where it is desired to start communication after detecting whether or not the sink device 320 is in the operating state, it is necessary to implement the Rx sense.

In a case where the normal HDMI cable 330 is connected, for example, when the operating state is a state in which 3.3 V of the TMDS line in the sink device has risen, a voltage monitor unit 312 constituting an Rx sense unit of the source device 310 monitors the voltage of a data line (TMDS line) to determine whether or not 3.3 V in the sink device has risen, thereby recognizing whether or not the sink device is in the operating state.

The above is operation of the Rx sense in a case where the normal HDMI cable 330 is connected; however, for example, in a case where an active optical cable (AOC) that performs communication using light instead of a copper wire is connected, the above-described Rx sense operation cannot be realized.

Figure 2:
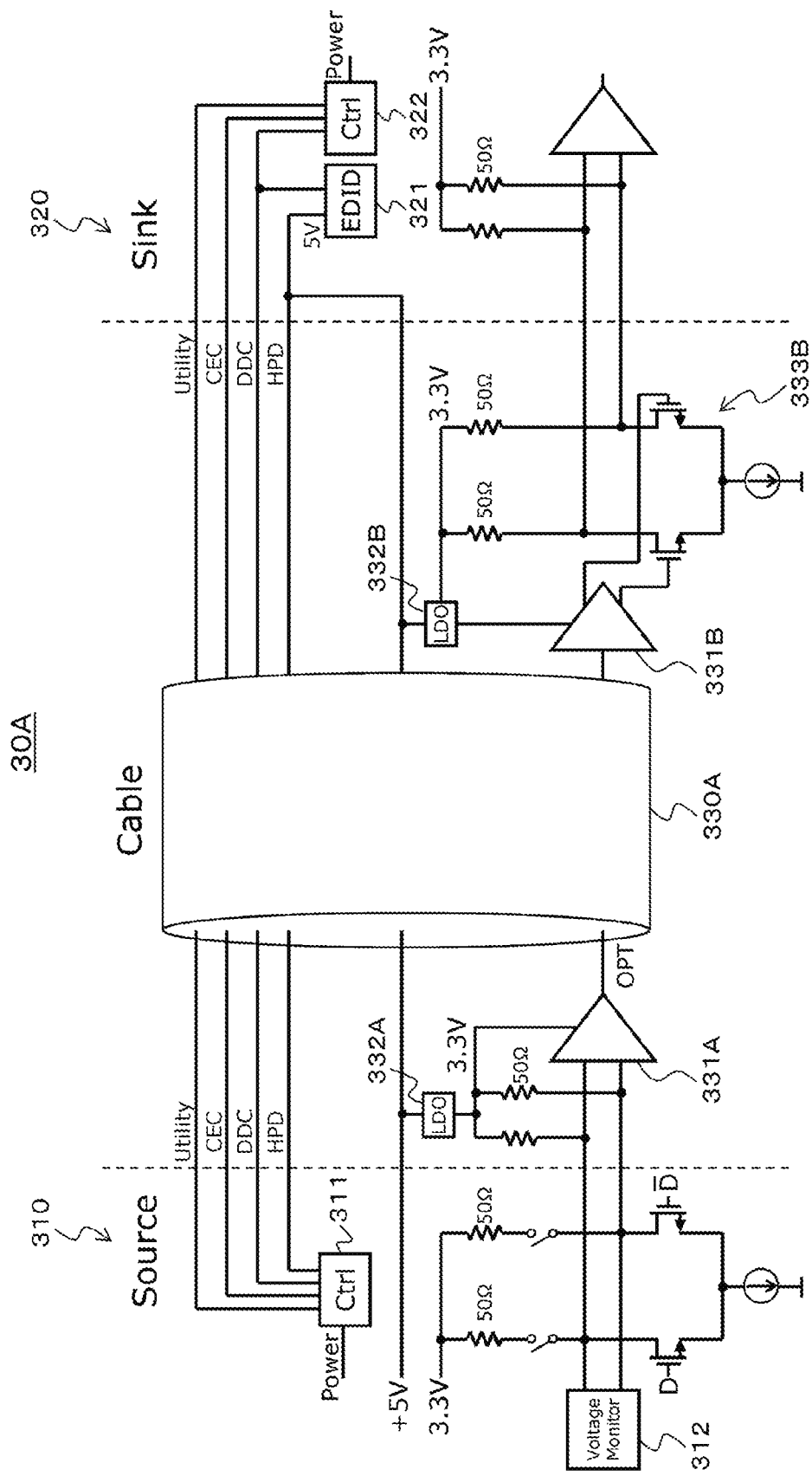
FIG. 2 is a diagram illustrating a configuration example of a transmission system in a case where an HDMI cable that is an AOC is used.

FIG. 2 illustrates a configuration example of a transmission system 30A in a case where an HDMI cable 330A that is an AOC is used. In FIG. 2, portions corresponding to those in FIG. 1 are denoted by the same reference numerals, and detailed description thereof is omitted.

In the case of the transmission system 30A, a conversion circuit 331A for converting electricity into light exists in a source side plug of the HDMI cable 330A, and furthermore, a conversion circuit 331B for converting light into electricity exists in a sink side plug of the HDMI cable 330A. These conversion circuits 331A and 331B are supplied with 3.3 V power sources obtained by low drop out (LDO) regulators 332A and 332B from +5 V of the +5 V power line.

Furthermore, in the source side plug of the HDMI cable 330A, 3.3 V obtained by the LDO regulator 332A is applied as a bias voltage to a data line (TMDS line) through a termination resistor of 50Ω. Moreover, in the sink side plug of the HDMI cable 330A, a current drive unit 333B is provided for transmitting a signal differentially on the basis of a differential signal obtained from the conversion circuit 331B.

The voltage monitor unit 312 constituting the Rx sense of the source device 310 detects 3.3 V applied to the data line on the source side. That is, the voltage monitor unit 312 misunderstands that the sink device 320 is in the operating state when the source side plug of the HDMI cable 330A is connected to the source device 310. This is similar even in a case where an active copper cable (ACC) is used as the HDMI cable.

Figure 3:
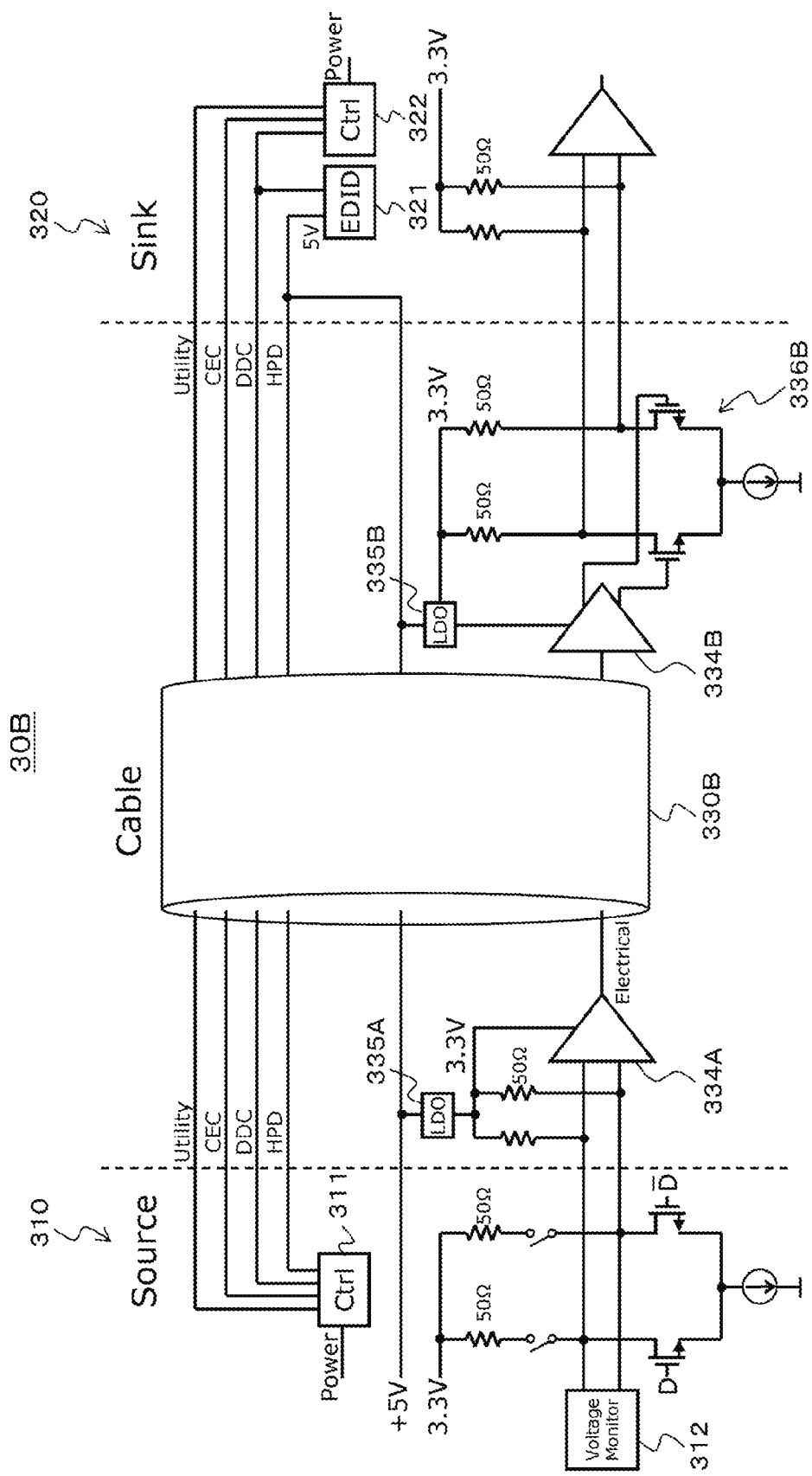
FIG. 3 is a diagram illustrating a configuration example of a transmission system in a case where an HDMI cable that is an ACC is used.

FIG. 3 illustrates a configuration example of a transmission system 30B in a case where an HDMI cable 330B that is an ACC is used. In FIG. 3, portions corresponding to those in FIGS. 1 and 2 are denoted by the same reference numerals, and detailed description thereof is omitted.

In the case of the transmission system 30B, circuits 334A and 334B for driving electrical 50Ω wiring exist in respective plugs on both sides of the HDMI cable 330B. These circuits 334A and 334B are supplied with 3.3 V power sources obtained by LDO regulators 335A and 335B from +5 V of the +5 V power line.

Furthermore, in a source side plug of the HDMI cable 330B, 3.3 V obtained by the LDO 335A is applied as a bias voltage to the data line (TMDS line) through a termination resistor of 50Ω. Moreover, in a sink side plug of the HDMI cable 330B, a current drive unit 336B is provided for transmitting a signal differentially on the basis of a differential signal obtained from the conversion circuit 334B.

The voltage monitor unit 312 constituting the Rx sense of the source device 310 detects 3.3 V applied to the data line on the source side. That is, the voltage monitor unit 312 misunderstands that the sink device 320 is in the operating state when the source side plug of the HDMI cable 330B is connected to the source device 310.

First Embodiment

Figure 4:
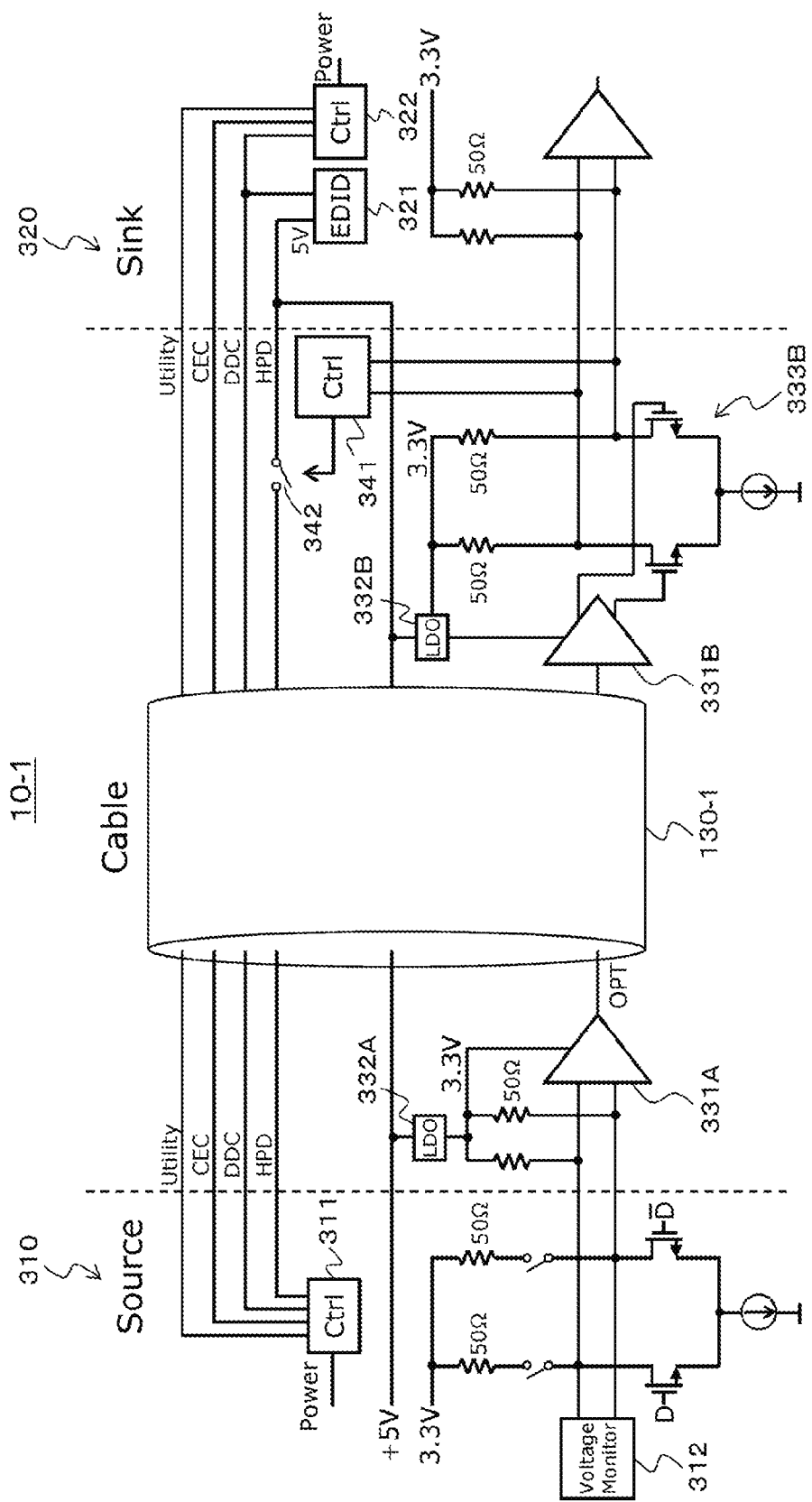
FIG. 4 is a diagram illustrating a configuration example of a transmission system as a first embodiment.

FIG. 4 illustrates a configuration example of a transmission system 10-1 as a first embodiment. This first embodiment is an example in which a communication permission signal (5 V signal) is output to a line (HPD line) through which the communication permission signal is supplied to a transmission device (source device) in response to detection information that a reception device (sink device) is in the operating state.

The transmission system 10-1 is an HDMI transmission system using HDMI as a digital interface. The transmission system 10-1 includes the source device 310 as a transmission device, the sink device 320 as a reception device, and an HDMI cable 130-1 that is an AOC that connects these devices to each other. In FIG. 4, portions corresponding to those in FIG. 2 are denoted by the same reference numerals, and detailed description thereof is omitted as appropriate.

In the case of the transmission system 10-1, the conversion circuit 331A for converting electricity into light exists in a source side plug of the HDMI cable 130-1, and furthermore, the conversion circuit 331B for converting light into electricity exists in a sink side plug of the HDMI cable 130-1. These conversion circuits 331A and 331B are supplied with the 3.3 V power sources obtained by the LDO regulators 332A and 332B from +5 V of the +5 V power line.

Furthermore, in the source side plug of the HDMI cable 130-1, 3.3 V obtained by the LDO regulator 332A is applied as a bias voltage to the data line (TMDS line) through a termination resistor of 50Ω. Moreover, in the sink side plug of the HDMI cable 130-1, the current drive unit 333B is provided for transmitting the signal differentially on the basis of the differential signal obtained from the conversion circuit 331B. The voltage monitor unit 312 constituting the Rx sense unit of the source device 310 detects 3.3 V applied to the data line on the source side when the source side plug of the HDMI cable 130-1 is connected to the source device 310.

In the sink side plug of the HDMI cable 130-1, a control unit 341 is provided, and a switch 342 is provided on the HPD line. The control unit 341 monitors the voltage of the data line on the sink side to determine whether or not 3.3 V in the sink device 320 has risen, and recognizes whether or not the sink device 320 is in the operating state. Furthermore, when the control unit 341 recognizes that the sink device 320 is in the operating state, the control unit 341 controls the switch 342 to be in the on (closed) state in response to detection information that the sink device 320 is in the operating state.

When the HDMI cable 130-1 is connected to the source device 310 and the sink device 320, power is supplied from the source device 310 to the HDMI cable 130-1 through the +5 V power line, and the power source is also supplied to the sink device 320 at the same time. At this time, a connection detection signal (HPD signal) indicating that the devices are connected to each other, that is, the 5 V signal is output to the HPD line from the sink device 320, but at this time point, since the switch 342 is in the off (open) state, the 5 V signal is not transmitted to the source device 310.

Thereafter, when the sink device 320 enters the operating state, 3.3 V in the sink device 320 rises. The control unit 341 recognizes the rise of 3.3 V and controls the switch 342 to be in the on (closed) state. The switch 342 is made to be in the on (closed) state as described above, whereby the connection detection signal (HPD signal) from the sink device 320 is transmitted to the source device 310 through the HPD line. Therefore, the source device 310 determines that the cable is correctly connected, and reads the EDID in the EDID ROM 321 on the sink device 320 side by using the DDC line.

In this case, the connection detection signal (HPD signal) sent from the sink device 320 to the source device 310 through the HPD line indicates AND of two states, a state where the HDMI cable 130-1 is correctly connected, and a state where the sink device 320 is in the operating state. Therefore, the source device 310 can start communication with the sink device 320 when the connection detection signal (HPD signal) is sent through the HPD line.

When the HDMI cable 130-1 is connected to the source device 310, the data line on the source side rises to 3.3 V. Therefore, the voltage monitor unit 312 of the source device 310 has already detected 3.3 V in the source side plug before the connection detection signal (HPD signal) is sent through the HPD line, and the Rx sense function can be realized as it is without requiring additional mounting on the source device 310 and the sink device 320.

In the transmission system 10-1 illustrated in FIG. 4, the control unit 341 in the sink side plug monitors the voltage of the data line (TMDS line) on the sink side to determine whether or not the sink device 320 is in the operating state, and controls the switch 342 to be in the on (closed) state in response to the detection information that the sink device 320 is in the operating state.

In this case, the connection detection signal (HPD signal) sent to the source device 310 through the HPD line indicates AND of the two states, the state where the HDMI cable 130-1 is correctly connected, and the state where the sink device 320 is in the operating state. Therefore, the source device 310 can satisfactorily detect whether or not the sink device 320 is in the operating state and start communication at an appropriate timing even in a case where an element that adjusts signal quality is interposed in the data line (TMDS line).

Second Embodiment

Figure 5:
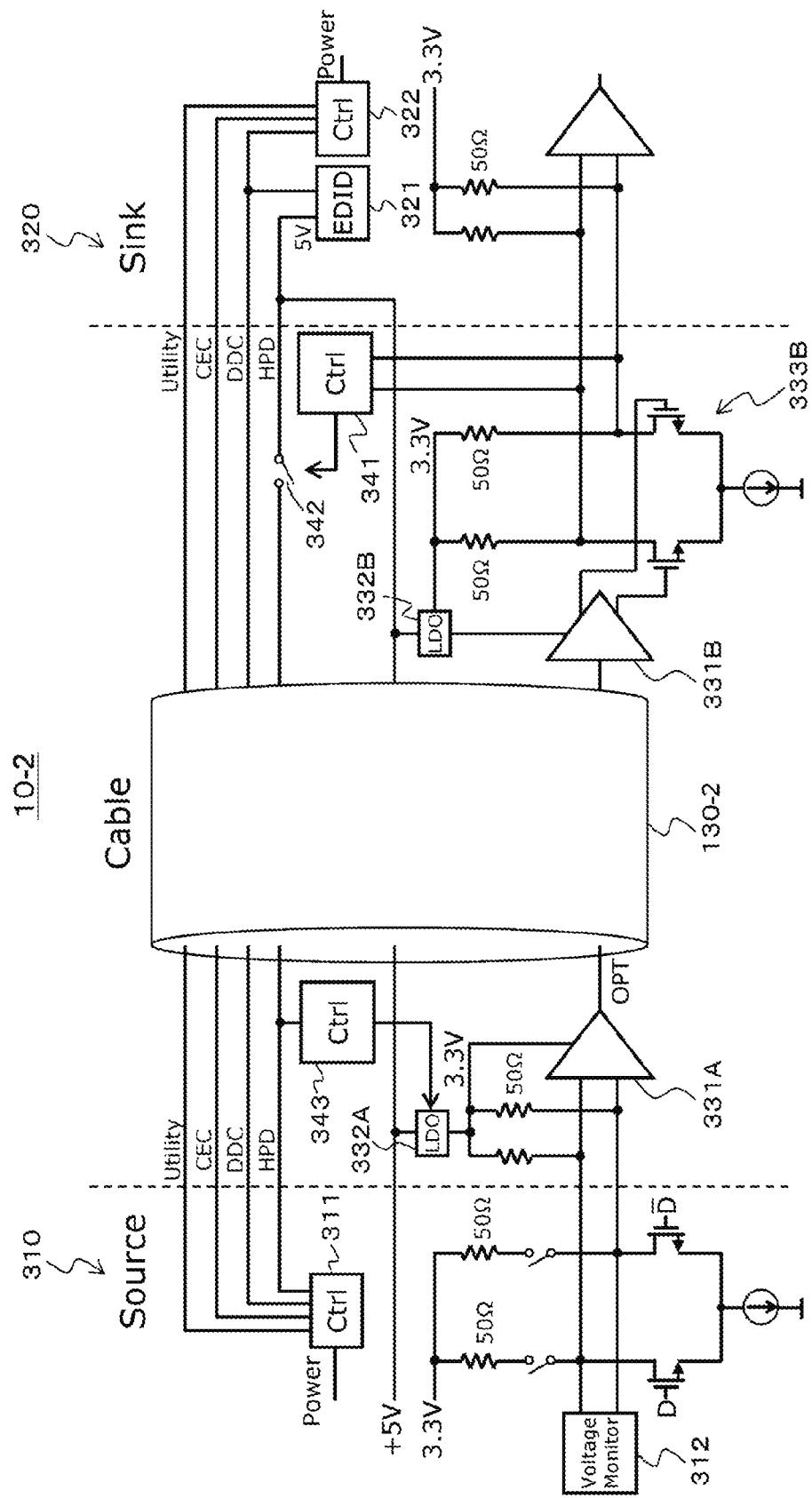
FIG. 5 is a diagram illustrating a configuration example of a transmission system as a second embodiment.

FIG. 5 illustrates a configuration example of a transmission system 10-2 as a second embodiment.

The transmission system 10-2 is an HDMI transmission system using HDMI as a digital interface. The transmission system 10-2 includes the source device 310 as a transmission device, the sink device 320 as a reception device, and an HDMI cable 130-2 that is an AOC that connects these devices to each other. In FIG. 5, portions corresponding to those in FIG. 4 are denoted by the same reference numerals, and detailed description thereof is omitted as appropriate.

In the transmission system 10-1 illustrated in FIG. 4 described above, 3.3 V is applied to the data line on the source side when the source side plug of the HDMI cable 130-1 is connected to the source device 310. In the transmission system 10-2 illustrated in FIG. 5, 3.3 V is applied to the data line on the source side after the connection detection signal (HPD signal) is sent to the source device 310 through the HPD line.

A control unit 343 is provided in a source side plug of the HDMI cable 130-1. The control unit 343 monitors the HPD line to determine whether or not the 5 V signal that is the connection detection signal (HPD signal) exists, and when the 5 V signal exists, causes the LDO regulator 332A to be in the operating state to generate 3.3 V. Therefore, at the same time or after the connection detection signal (HPD signal) is sent to the source device 310 through the HPD line, 3.3 V (Rx sense information) is applied to the data line on the source side, and is detected by the voltage monitor unit 312 constituting the Rx sense unit of the source device 310.

Note that, by providing a timer in the control unit 343 in the source side plug, it is also possible to cause the LDO regulator 332A to be in the operating state with an arbitrary delay after the connection detection signal (HPD signal) is sent to the source device 310 through the HPD line, and it can be considered to adjust the detection timing of 3.3 V of the data line on the source side in the voltage monitor unit 312 of the source device 310.

In the transmission system 10-2 illustrated in FIG. 5, an effect can be obtained similar to that in the transmission system 10-1 illustrated in FIG. 4, and moreover, the LDO regulator 332A is caused to be in the operating state after the connection detection signal (HPD signal) is sent to the source device 310 through the HPD line, so that the current consumption can be reduced.

Third Embodiment

Figure 6:
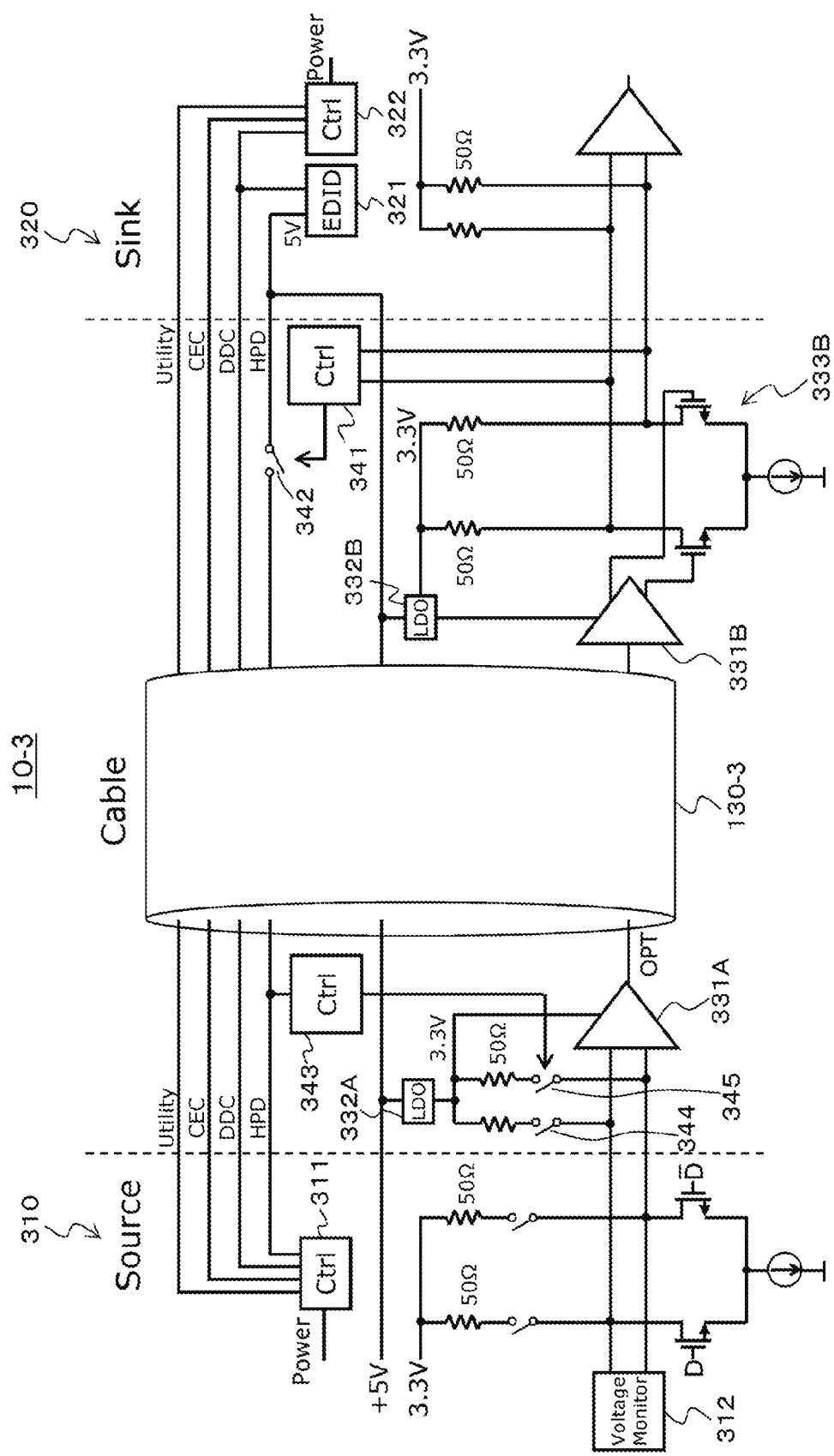
FIG. 6 is a diagram illustrating a configuration example of a transmission system as a third embodiment.

FIG. 6 illustrates a configuration example of a transmission system 10-3 as a third embodiment.

The transmission system 10-3 is an HDMI transmission system using HDMI as a digital interface. The transmission system 10-3 includes the source device 310 as a transmission device, the sink device 320 as a reception device, and an HDMI cable 130-3 that is an AOC that connects these devices to each other. In FIG. 6, portions corresponding to those in FIG. 5 are denoted by the same reference numerals, and detailed description thereof is omitted as appropriate.

In the transmission system 10-2 illustrated in FIG. 5 described above, when the 5 V signal that is the connection detection signal (HPD signal) exists on the HPD line, the LDO regulator 332A is caused to be in the operating state, whereby 3.3 V (Rx sense information) is applied to the data line on the source side. In the transmission system 10-3 illustrated in FIG. 6, switches 344 and 345 are provided in series with respective termination resistors of 50Ω, and when the 5 V signal that is the connection detection signal (HPD signal) exists on the HPD line, the switches 344 and 345 are caused to be in the on (closed) state, whereby 3.3 V (Rx sense information) is applied to the data line on the source side.

The transmission system 10-3 illustrated in FIG. 6 operates similarly to the transmission system 10-2 illustrated in FIG. 5, and a similar effect can be obtained.

Fourth Embodiment

Figure 7:
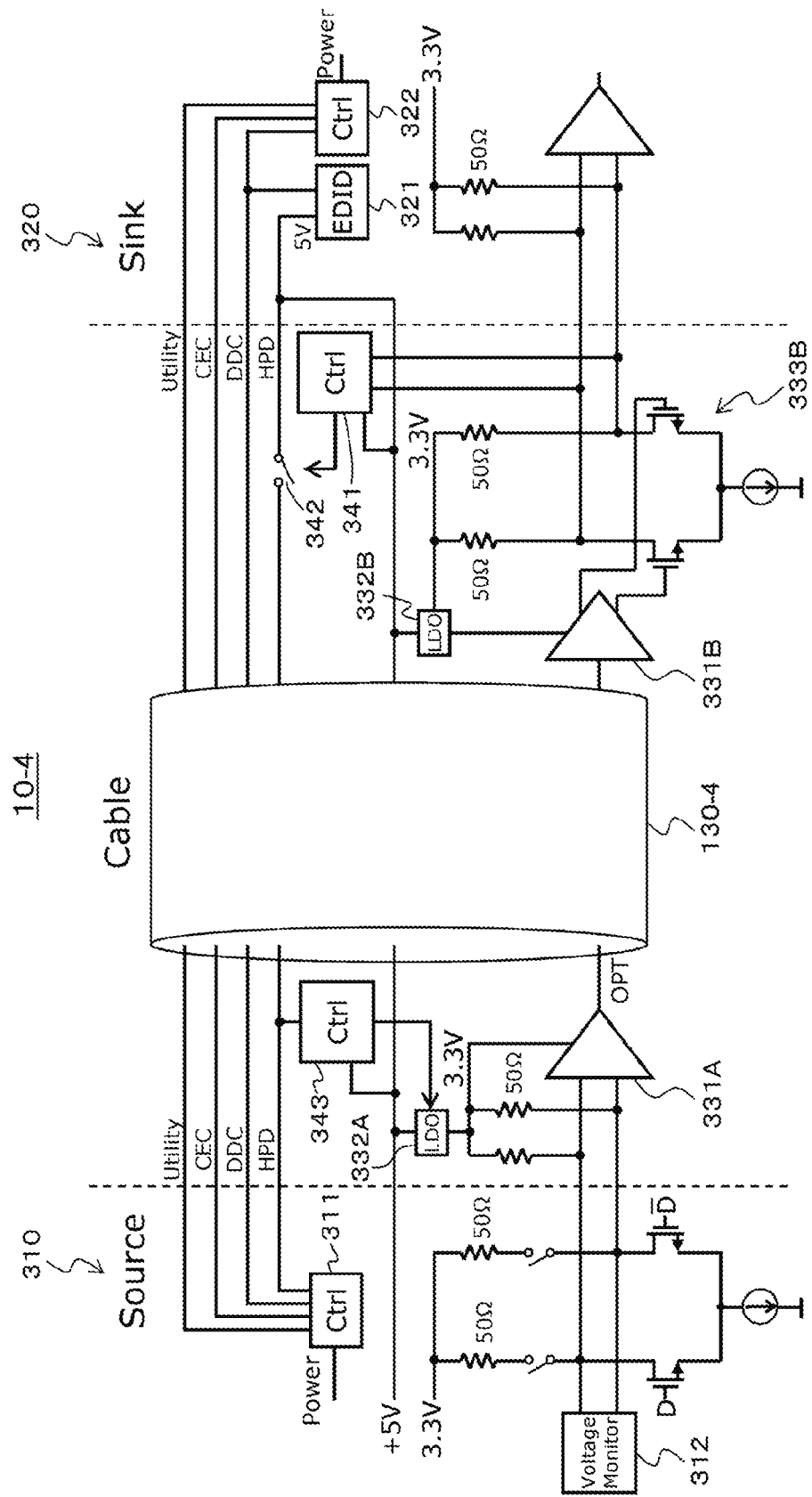
FIG. 7 is a diagram illustrating a configuration example of a transmission system as a fourth embodiment.

FIG. 7 illustrates a configuration example of a transmission system 10-4 as a fourth embodiment.

The transmission system 10-4 is an HDMI transmission system using HDMI as a digital interface. The transmission system 10-4 includes the source device 310 as a transmission device, the sink device 320 as a reception device, and an HDMI cable 130-4 that is an AOC that connects these devices to each other. In FIG. 7, portions corresponding to those in FIG. 6 are denoted by the same reference numerals, and detailed description thereof is omitted as appropriate.

In the transmission systems 10-1 to 10-3 illustrated in FIGS. 4 to 6, regarding power sources of the control units 341 and 343 provided in the sink side plug and the source side plug, the power sources may be directly supplied from the +5 V power line, and in the sink side plug, the power source obtained by the LDO regulator 332B for high-speed signal lines may be used, or the power source may be supplied from 5 V of the HPD line output from the sink device 320. In the transmission system 10-4 illustrated in FIG. 7, an example is illustrated in which the power sources of the control unit 341 and the control unit 343 are supplied from the +5 V power line.

In the transmission system 10-4 illustrated in FIG. 7, an effect can be obtained similar to that in the transmission system 10-3 illustrated in FIG. 6.

Fifth Embodiment

Figure 8:
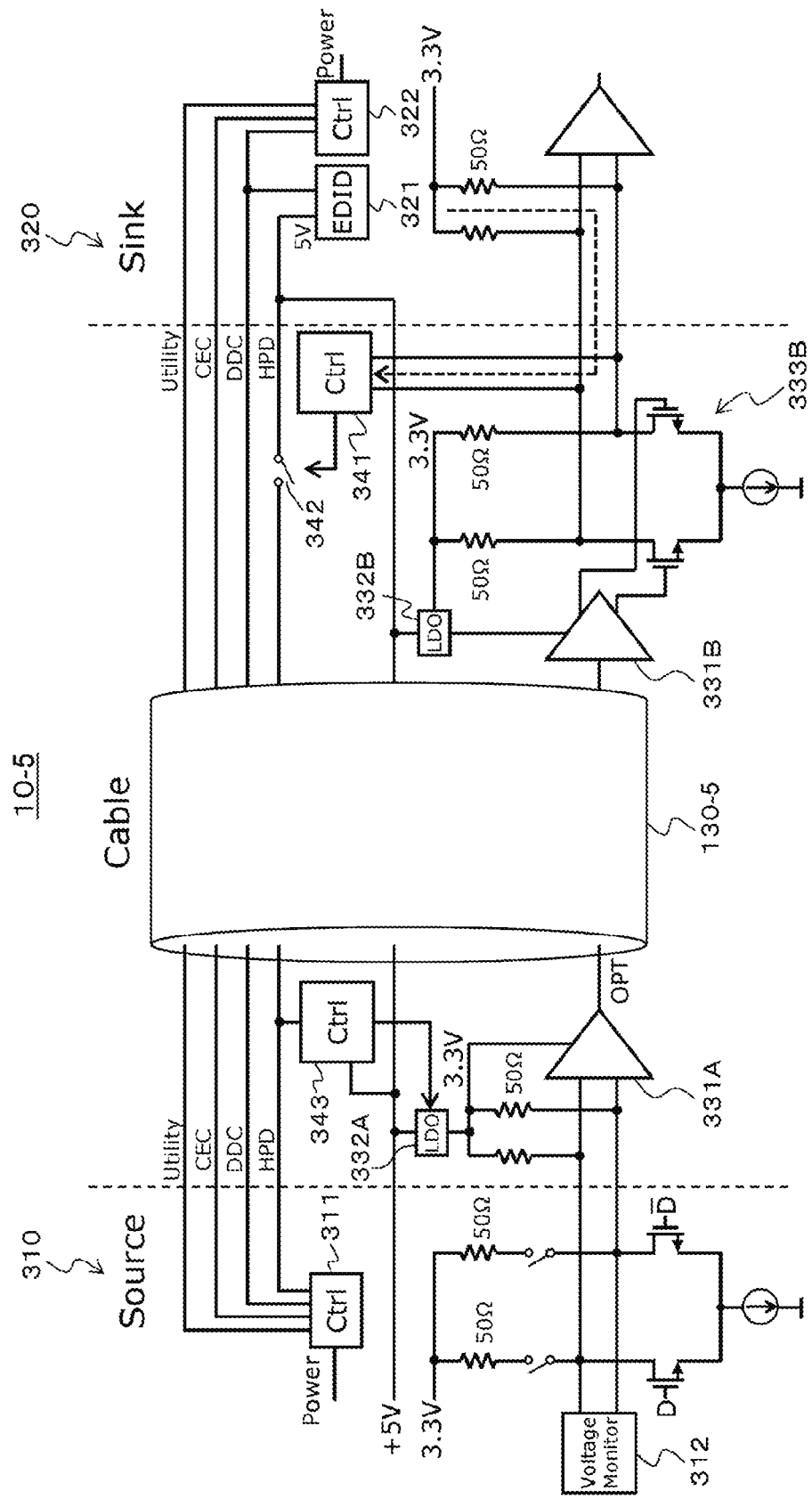
FIG. 8 is a diagram illustrating a configuration example of a transmission system as a fifth embodiment.

FIG. 8 illustrates a configuration example of a transmission system 10-5 as a fifth embodiment.

The transmission system 10-5 is an HDMI transmission system using HDMI as a digital interface. The transmission system 10-5 includes the source device 310 as a transmission device, the sink device 320 as a reception device, and an HDMI cable 130-5 that is an AOC that connects them to each other. In FIG. 8, portions corresponding to those in FIG. 7 are denoted by the same reference numerals, and detailed description thereof is omitted as appropriate.

In the transmission system 10-4 illustrated in FIG. 7 described above, the power source of the control unit 341 provided in the sink side plug is supplied from the +5 V power line. In the transmission system 10-5 illustrated in FIG. 8, regarding the power source of the control unit 341, a current is drawn from the 3.3 V power source in the sink device 320, and a power source is newly generated by using a DC/DC converter (not illustrated) or the like.

In the transmission system 10-5 illustrated in FIG. 8, an effect can be obtained similar to that in the transmission system 10-4 illustrated in FIG. 7.

Sixth Embodiment

Figure 9:
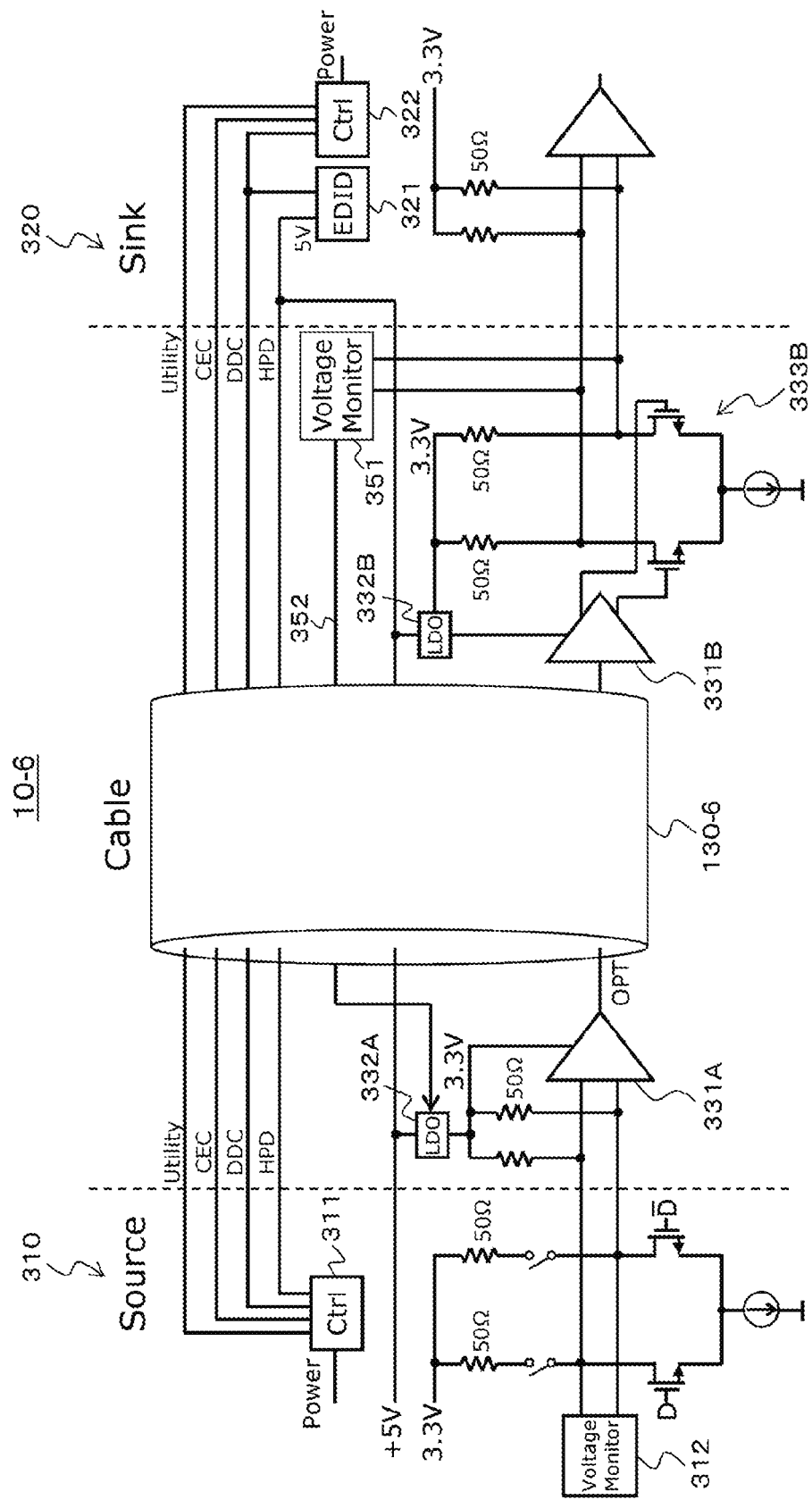
FIG. 9 is a diagram illustrating a configuration example of a transmission system as a sixth embodiment.

FIG. 9 illustrates a configuration example of a transmission system 10-6 as a sixth embodiment. The sixth embodiment is an example in which a predetermined voltage (3.3 V) is applied to the data line (TMDS line) on the transmission device (source device) side in response to the detection information that the reception device (sink device) is in the operating state.

The transmission system 10-6 is an HDMI transmission system using HDMI as a digital interface. The transmission system 10-6 includes the source device 310 as a transmission device, the sink device 320 as a reception device, and an HDMI cable 130-6 that is an AOC that connects them to each other. In FIG. 9, portions corresponding to those in FIG. 2 are denoted by the same reference numerals, and detailed description thereof is omitted as appropriate.

In the case of the transmission system 10-6, the conversion circuit 331A for converting electricity into light exists in a source side plug of the HDMI cable 130-6, and furthermore, the conversion circuit 331B for converting light into electricity exists in a sink side plug of the HDMI cable 130-6. These conversion circuits 331A and 331B are supplied with the 3.3 V power sources obtained by the LDO regulators 332A and 332B from +5 V of the +5 V power line.

Furthermore, in the source side plug of the HDMI cable 130-6, 3.3 V obtained by the LDO regulator 332A is applied as a bias voltage to the data line (TMDS line) through a termination resistor of 50Ω. Moreover, in the sink side plug of the HDMI cable 130-6, the current drive unit 333B is provided for transmitting the signal differentially on the basis of the differential signal obtained from the conversion circuit 331B.

A voltage monitor unit 351 is provided in the sink side plug of the HDMI cable 130-6. The voltage monitor unit 351 monitors the voltage of the data line on the sink side to determine whether or not 3.3 V in the sink device 320 has risen, and recognizes whether or not the sink device 320 is in the operating state.

Then, the voltage monitor unit 351 sends the detection information that the sink device 320 is in the operating state to the LDO regulator 332A in the source side plug through a dedicated line 352. The LDO regulator 332A is caused to be in the operating state in response to the detection information and generates 3.3 V. Therefore, 3.3 V is applied to the data line (TMDS line) as a bias voltage through a termination resistor of 50Ω.

When the HDMI cable 130-6 is connected to the source device 310 and the sink device 320, a voltage of 5 V is transmitted from the source device 310 to the sink device 320 via the +5 V power line, and when 5 V is detected in the sink device 320, 5 V is transmitted from the sink device 320 to the source device 310 via the HPD line, whereby the source device 310 is informed that the cable is correctly connected. When detecting 5 V of the HPD line, the control unit 311 of the source device 310 determines that the cable 130-6 is connected, and reads the EDID in the EDID ROM 321 on the sink device 320 side by using the DDC line.

Thereafter, when the sink device 320 enters the operating state, 3.3 V in the sink device 320 rises. The voltage monitor unit 351 recognizes the rise of 3.3 V and sends the detection information that the sink device 320 is in the operating state to the LDO regulator 332A in the source side plug through the dedicated line 352. Therefore, the LDO regulator 332A is caused to be in the operating state, and 3.3 V is applied to the data line (TMDS line) on the source side through the termination resistor of 50Ω, and 3.3 V is detected by the voltage monitor unit 312 constituting the Rx sense unit of the source device 310.

In the transmission system 10-6 illustrated in FIG. 9, the voltage monitor unit 351 in the sink side plug monitors the voltage of the data line (TMDS line) on the sink side to determine whether or not the sink device 320 is in the operating state, and sends the detection information that the sink device 320 is in the operating state to the LDO regulator 332A in the source side plug through the dedicated line 352 to cause the LDO regulator 332A to be in the operating state.

In this case, a bias voltage of 3.3 V is applied to the data line (TMDS line) on the source side, and is detected by the voltage monitor unit 312 constituting the Rx sense unit of the source device 310. Therefore, the source device 310 can satisfactorily detect whether or not the sink device 320 is in the operating state and start communication at an appropriate timing even in a case where an element that adjusts signal quality is interposed in the data line (TMDS line).

Note that, in the transmission system 10-6 illustrated in FIG. 9 described above, the dedicated line 352 is used for transmitting the detection information that the sink device 320 is in the operating state from the voltage monitor unit 351 in the sink side plug to the LDO regulator 332A in the source side plug. In this case, addition is performed only in the HDMI cable 130-6, and no additional HDMI connector pin is required, and the existing HDMI is not affected.

Seventh Embodiment

Figure 10:
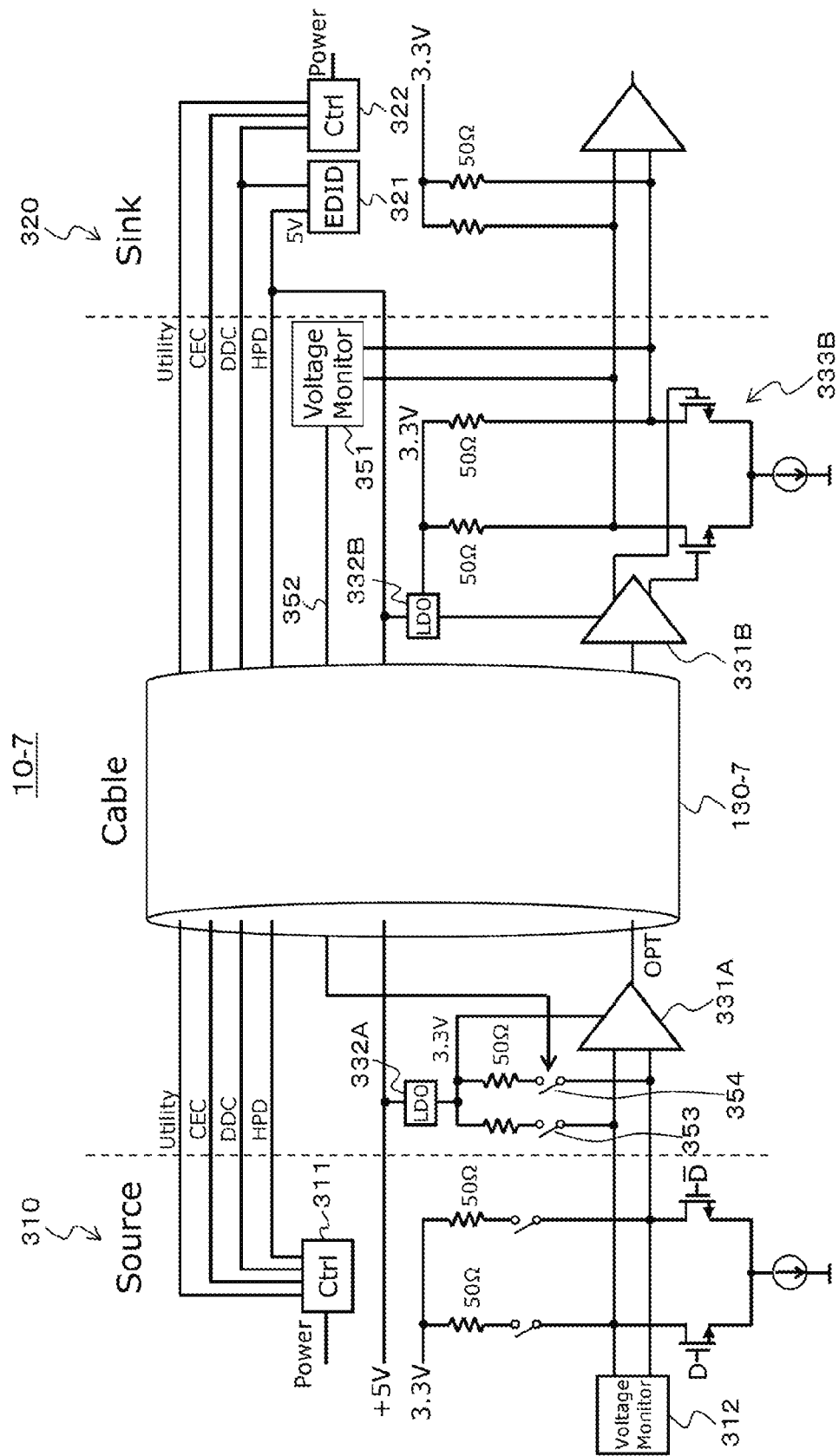
FIG. 10 is a diagram illustrating a configuration example of a transmission system as a seventh embodiment.

FIG. 10 illustrates a configuration example of a transmission system 10-7 as a seventh embodiment. The seventh embodiment is also an example in which a predetermined voltage (3.3 V) is applied to the data line (TMDS line) on the transmission device (source device) side in response to the detection information that the reception device (sink device) is in the operating state.

The transmission system 10-7 is an HDMI transmission system using HDMI as a digital interface. The transmission system 10-7 includes the source device 310 as a transmission device, the sink device 320 as a reception device, and an HDMI cable 130-7 that is an AOC that connects these devices to each other. In FIG. 10, portions corresponding to those in FIG. 9 are denoted by the same reference numerals, and detailed description thereof is omitted as appropriate.

In the transmission system 10-6 illustrated in FIG. 9 described above, the LDO regulator 332A is caused to be in the operating state in response to the detection information that the sink device 320 is in the operating state from the voltage monitor unit 351 in the sink side plug, whereby 3.3 V (Rx sense information) is applied to the data line on the source side. In the transmission system 10-7 illustrated in FIG. 10, switches 353 and 354 are provided in series with respective termination resistors of 50Ω, and the switches 353 and 354 are caused to be in the on (closed) state in response to the detection information described above, whereby 3.3 V (Rx sense information) is applied to the data line on the source side.

The transmission system 10-7 illustrated in FIG. 10 operates similarly to the transmission system 10-6 illustrated in FIG. 9, and a similar effect can be obtained.

Eighth Embodiment

Figure 11:
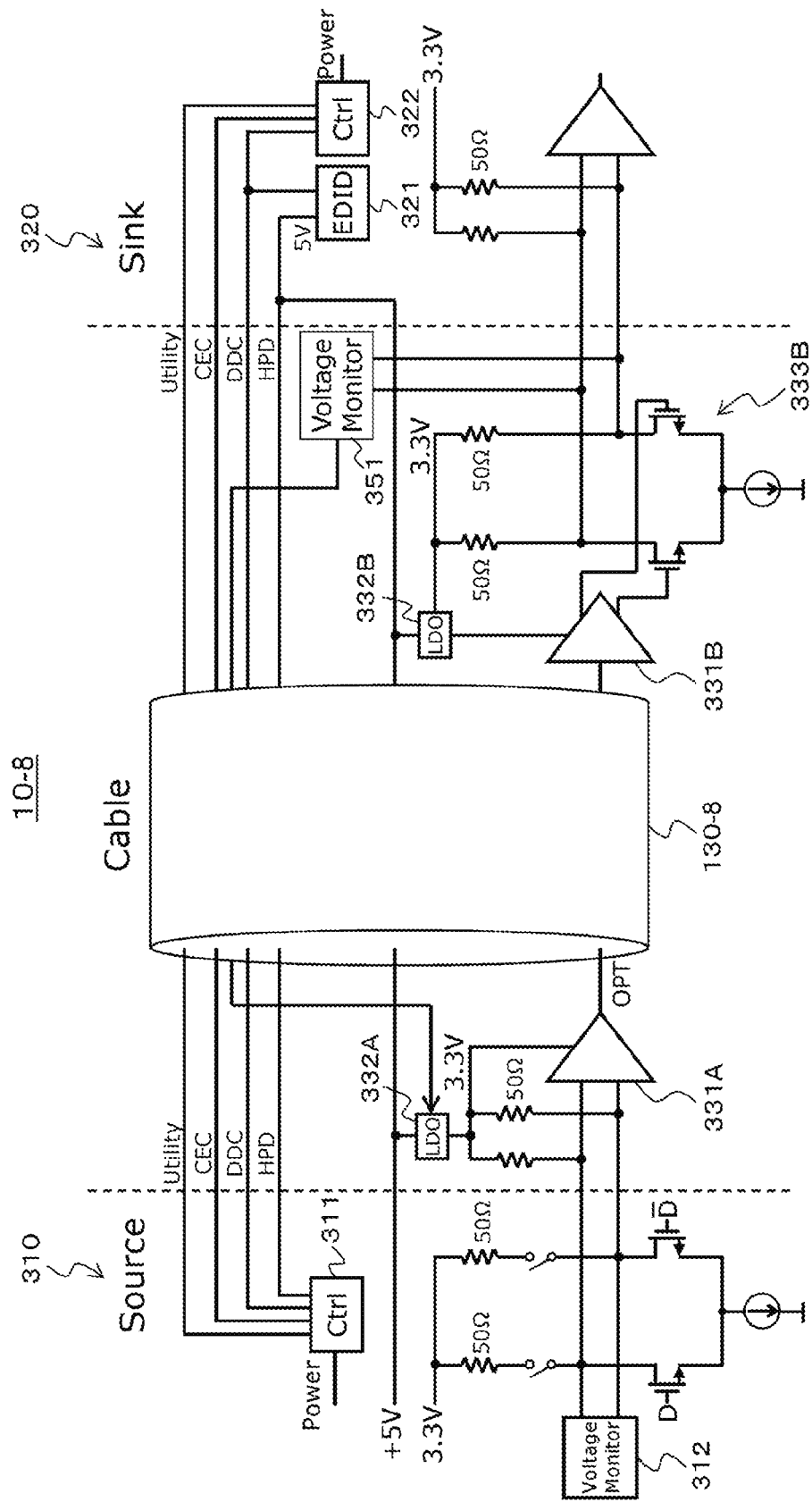
FIG. 11 is a diagram illustrating a configuration example of a transmission system as an eighth embodiment.

FIG. 11 illustrates a configuration example of a transmission system 10-8 as an eighth embodiment. The eighth embodiment is also an example in which a predetermined voltage (3.3 V) is applied to the data line (TMDS line) on the transmission device (source device) side in response to the detection information that the reception device (sink device) is in the operating state.

The transmission system 10-8 is an HDMI transmission system using HDMI as a digital interface. The transmission system 10-8 includes the source device 310 as a transmission device, the sink device 320 as a reception device, and an HDMI cable 130-8 that is an AOC that connects them to each other. In FIG. 11, portions corresponding to those in FIG. 9 are denoted by the same reference numerals, and detailed description thereof is omitted as appropriate.

In the transmission system 10-6 illustrated in FIG. 9 described above, the detection information that the sink device 320 is in the operating state from the voltage monitor unit 351 in the sink side plug is sent as a control signal to the LDO regulator 332A in the source side plug through the dedicated line 352. In the transmission system 10-8 illustrated in FIG. 11, the detection information that the sink device 320 is in the operating state from the voltage monitor unit 351 is superimposed on the DDC line, CEC line, HPD line, Utility line, or the like defined in the HDMI standard, and sent as a control signal to the LDO regulator 332A in the source side plug.

The transmission system 10-8 illustrated in FIG. 11 operates similarly to the transmission system 10-6 illustrated in FIG. 9, and a similar effect can be obtained.

Ninth Embodiment

Figure 12:
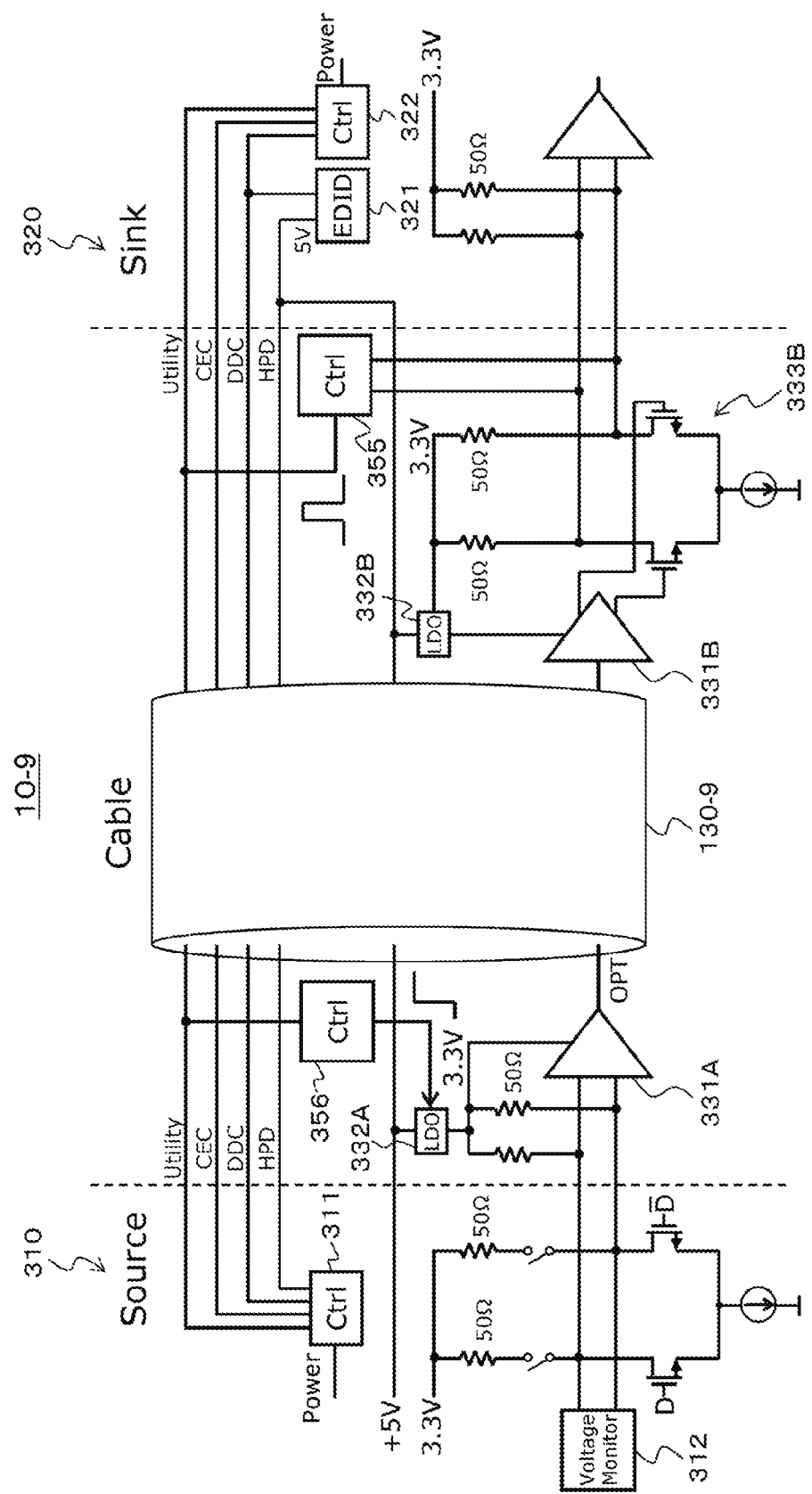
FIG. 12 is a diagram illustrating a configuration example of a transmission system as a ninth embodiment.

FIG. 12 illustrates a configuration example of a transmission system 10-9 as a ninth embodiment. The ninth embodiment is also an example in which a predetermined voltage (3.3 V) is applied to the data line (TMDS line) on the transmission device (source device) side in response to the detection information that the reception device (sink device) is in the operating state.

The transmission system 10-9 is an HDMI transmission system using HDMI as a digital interface. The transmission system 10-9 includes the source device 310 as a transmission device, the sink device 320 as a reception device, and an HDMI cable 130-9 that is an AOC that connects these devices to each other. In FIG. 12, portions corresponding to those in FIG. 9 are denoted by the same reference numerals, and detailed description thereof is omitted as appropriate.

In the transmission system 10-6 illustrated in FIG. 9 described above, the detection information that the sink device 320 is in the operating state from the voltage monitor unit 351 in the sink side plug is sent as a control signal to the LDO regulator 332A in the source side plug through the dedicated line 352. In the transmission system 10-9 illustrated in FIG. 12, the detection information that the sink device 320 is in the operating state from the control unit 355 is superimposed on the Utility line considered to have the least influence on the source device 310 and the sink device 320, and sent as a control signal to the LDO regulator 332A in the source side plug.

In this case, the detection information from the control unit 355 is transmitted to the source side plug as a pulse signal. A control unit 356 is provided in the source side plug. The control unit 356 detects the rise of the pulse signal transmitted from the sink side plug through the Utility line, and causes the LDO regulator 332A to be in the operating state.

The transmission system 10-9 illustrated in FIG. 12 operates similarly to the transmission system 10-6 illustrated in FIG. 9, and a similar effect can be obtained.

Tenth Embodiment

Figure 13:
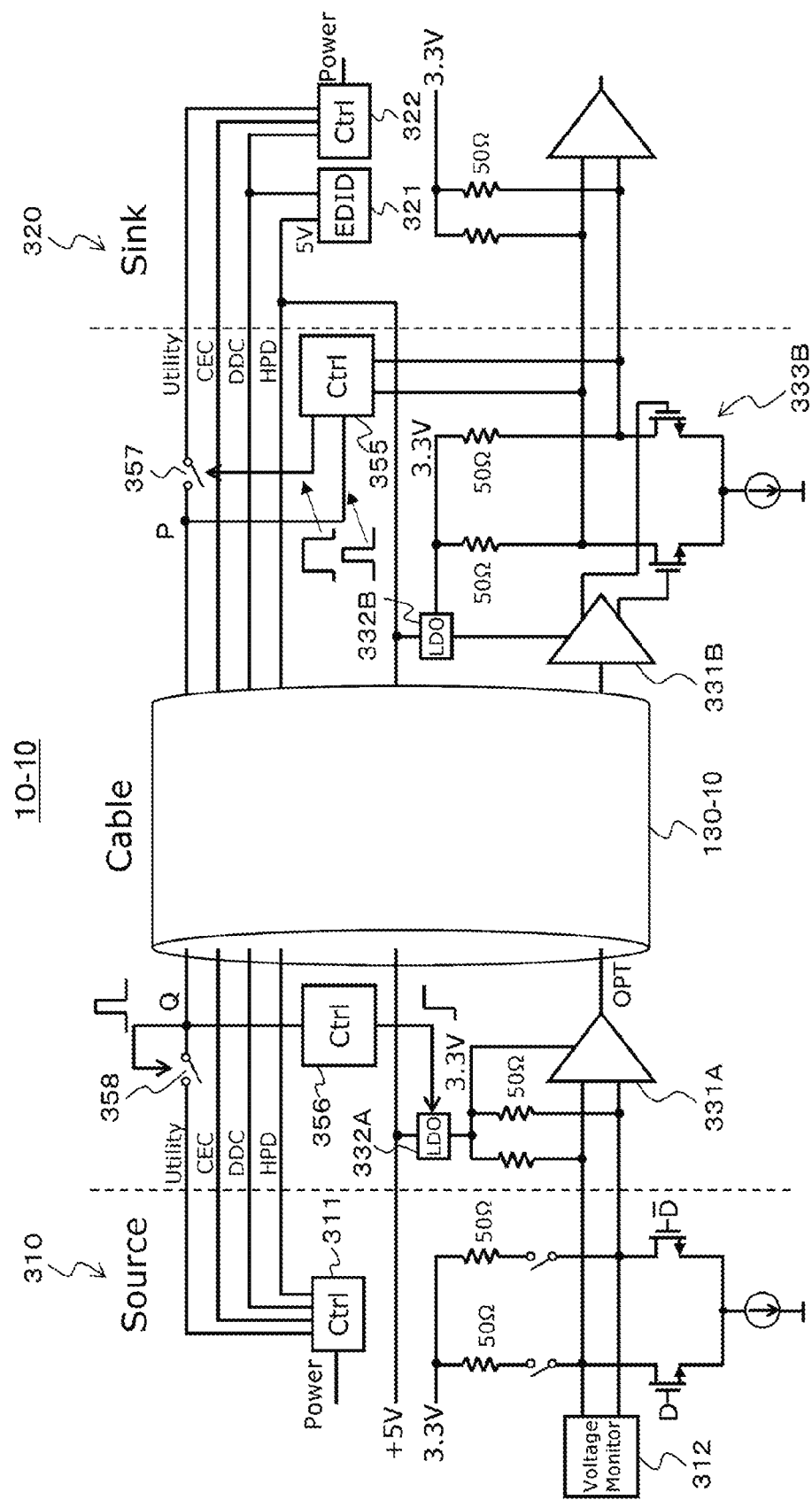
FIG. 13 is a diagram illustrating a configuration example of a transmission system as a tenth embodiment.

FIG. 13 illustrates a configuration example of a transmission system 10-10 as a tenth embodiment. The tenth embodiment is also an example in which a predetermined voltage (3.3 V) is applied to the data line (TMDS line) on the transmission device (source device) side in response to the detection information that the reception device (sink device) is in the operating state.

The transmission system 10-10 is an HDMI transmission system using HDMI as a digital interface. The transmission system 10-10 includes the source device 310 as a transmission device, the sink device 320 as a reception device, and an HDMI cable 130-10 that is an AOC that connects these devices to each other. In FIG. 13, portions corresponding to those in FIG. 12 are denoted by the same reference numerals, and detailed description thereof is omitted as appropriate.

In the transmission system 10-9 illustrated in FIG. 12 described above, the pulse signal superimposed on the Utility line is also transmitted to the source device 310 and the sink device 320. Therefore, there is a possibility that the source device 310 and the sink device 320 malfunction due to unintended information. The transmission system 10-10 illustrated in FIG. 13 is configured so that the pulse signal superimposed on the Utility line is not transmitted to the source device 310 and the sink device 320.

In the sink side plug, a switch 357 is provided on the Utility line. The switch 357 is arranged closer to the sink device 320 side than a superimposed position P of the pulse signal from the control unit 355. Furthermore, in the source side plug, a switch 358 is provided on the Utility line. The switch 358 is arranged closer to the source device 310 side than an extraction position Q of the pulse signal in the control unit 356.

These switches 357 and 358 are caused to be in the off (open) state in the initial state. Then, the switches are caused to be in the on (closed) state after the fall of the pulse signal superimposed on the Utility line from the control unit 355. Therefore, when the switches 357 and 358 are in the off (opened) state, the pulse signal can be transmitted for causing the LDO regulator 332A in the source side plug to be in the operating state, and it is avoided that the pulse signal is transmitted to the source device 310 and the sink device 320.

Note that, by detecting and resetting the 5 V signal that is the connection detection signal (HPD signal) obtained on the HPD line when the HDMI cable 130-10 is connected, the switches 357 and 358 are always reset when the HDMI cable 130-10 is connected, and the switches 357 and 358 each are in the initial state.

In the transmission system 10-10 illustrated in FIG. 13, an effect can be obtained similar to that in the transmission system 10-9 illustrated in FIG. 12 without causing problems due to the pulse signal in the source device 310 and the sink device 320.

Eleventh Embodiment

Figure 14:
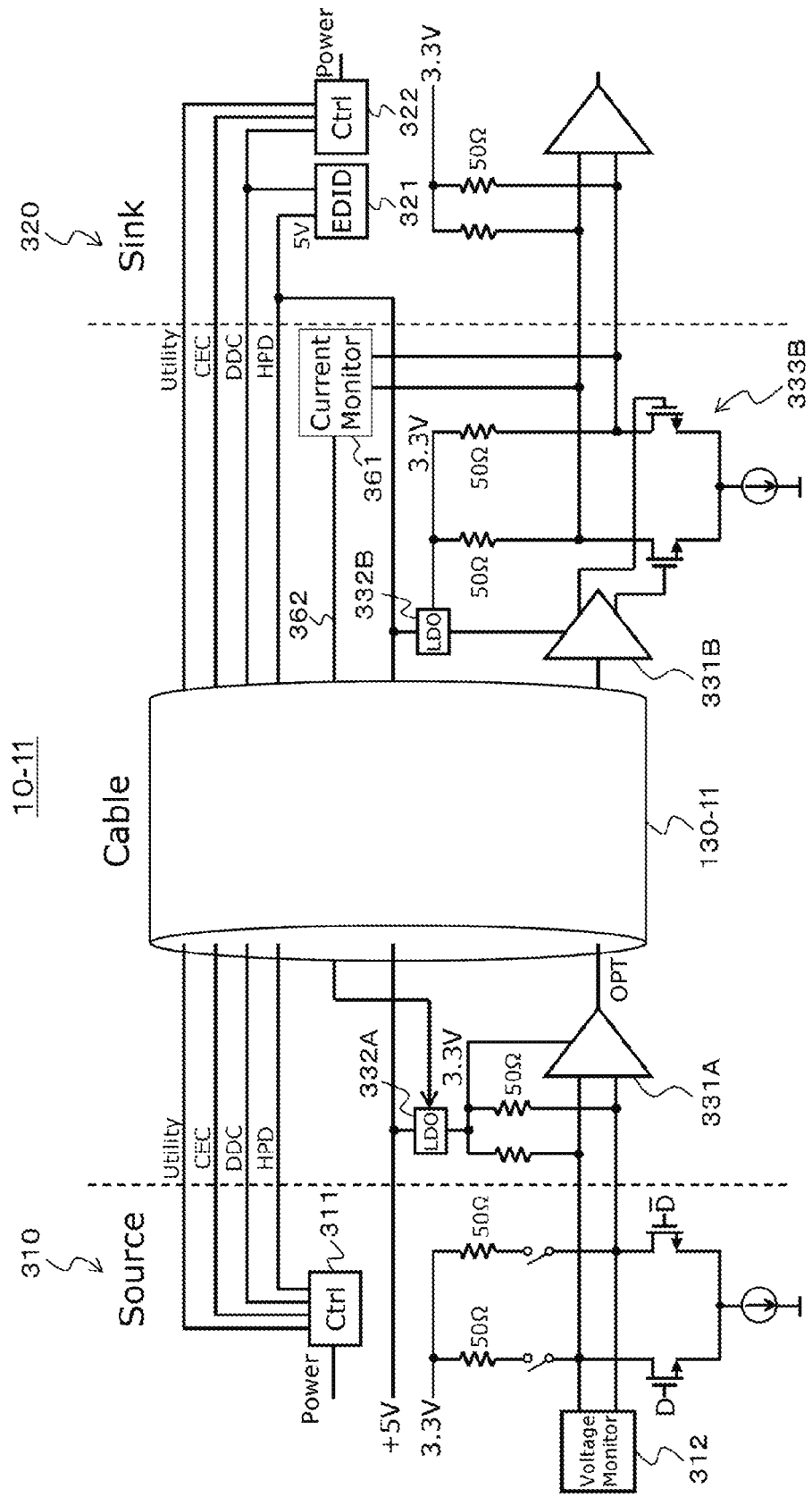
FIG. 14 is a diagram illustrating a configuration example of a transmission system as an eleventh embodiment.

FIG. 14 illustrates a configuration example of a transmission system 10-11 as an eleventh embodiment. The eleventh embodiment is also an example in which a predetermined voltage (3.3 V) is applied to the data line (TMDS line) on the transmission device (source device) side in response to the detection information that the reception device (sink device) is in the operating state.

The transmission system 10-11 is an HDMI transmission system using HDMI as a digital interface. The transmission system 10-11 includes the source device 310 as a transmission device, the sink device 320 as a reception device, and an HDMI cable 130-11 that is an AOC that connects these devices to each other. In FIG. 14, portions corresponding to those in FIG. 9 are denoted by the same reference numerals, and detailed description thereof is omitted as appropriate.

In each of the embodiments described above, monitoring is performed whether or not the voltage of the data line (TMDS line) is 3.3 V in the sink side plug, whereby it is determined whether or not the sink device 320 is in the operating state. In the transmission system 10-11 illustrated in FIG. 14, a current flowing from 3.3 V of the sink device 320 is monitored, and it is determined whether or not the sink device 320 is in the operating state.

A current monitor unit 361 is provided in the sink side plug of the HDMI cable 130-11. This current monitor unit 361 monitors the current flowing from 3.3 V of the sink device 320 to determine whether or not 3.3 V in the sink device 320 has risen, and recognizes whether or not the sink device 320 is in the operating state.

Then, the current monitor unit 361 sends the detection information that the sink device 320 is in the operating state to the LDO regulator 332A in the source side plug through a dedicated line 362. The LDO regulator 332A is caused to be in the operating state in response to the detection information and generates 3.3 V. Therefore, 3.3 V is applied to the data line (TMDS line) as a bias voltage through a termination resistor of 50Ω.

Figure 15:
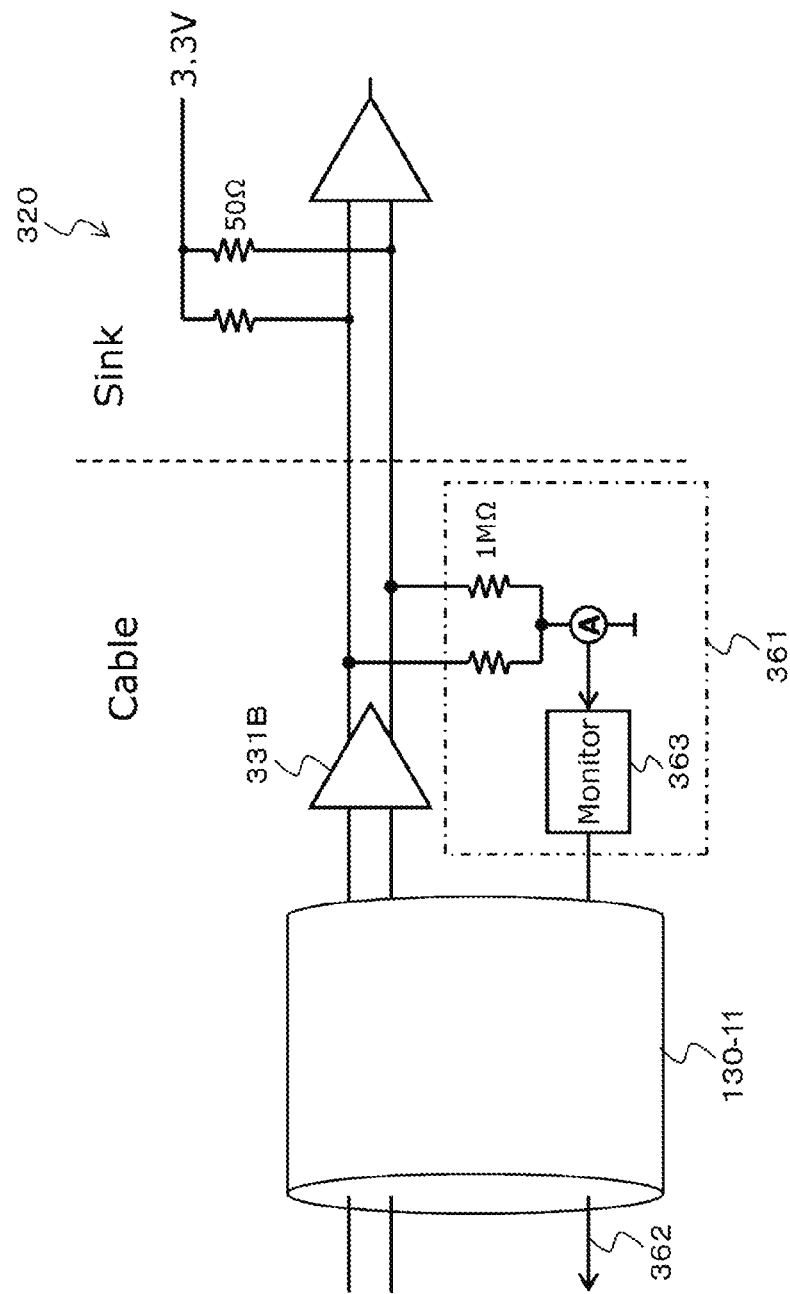
FIG. 15 is a diagram illustrating a configuration example of a current monitor unit.

FIG. 15 illustrates a configuration example of the current monitor unit 361. In this configuration, a high resistance resistor (for example, 1 MΩ) is sandwiched between the data line (TMDS line) and GND, and a minute current flowing through the additional resistor is monitored by a monitor unit 363. Here, if the high resistance is 1 MΩ, the current flowing through the additional resistor is about 3.3 μA (=3.3/(1 M+50)), so that the influence on the data line can be ignored.

The transmission system 10-11 illustrated in FIG. 14 operates similarly to the transmission system 10-6 illustrated in FIG. 9, and a similar effect can be obtained.

<2. Modifications>

Note that, in the above embodiment, as an example, the transmission system has been described in which the source device and the sink device are connected to each other by the HDMI cable. However, since the present technology can also be applied similarly to a cable using a mechanism defined in "VESA Plug and Display (P&D) Specification" between the transmission device and the reception device, the present technology can also be applied to DVI, MHL, Display Port, and the like. Furthermore, the present technology can be applied not only to AOC and ACC, but also to wireless communication and the like.

Furthermore, the present technology may also be embodied in the configurations described below.

(1) A cable connected between a transmission device and a reception device,
the cable including:
an element that adjusts signal quality, interposed in a data line;
a detection unit that detects that the reception device is in an operating state; and an information supply unit that supplies the detection information to the transmission device through a predetermined line.

(2) The cable according to (1), in which
the detection unit determines that the reception device is in the operating state when a predetermined voltage is applied to the data line on the reception device's side.

(3) The cable according to (1) or (2), in which
the information supply unit outputs, to a line through which a communication permission signal is supplied to the transmission device, the communication permission signal in response to the detection information.

(4) The cable according to (3), in which
the line through which the communication permission signal is supplied is an HPD line.

(5) The cable according to (4), in which
the information supply unit changes a switch provided on the HPD line from off to on in response to the detection information.

(6) The cable according to (5), further including
a data application unit that applies a predetermined voltage to a data line on the transmission device's side.

(7) The cable according to (6), in which
the data application unit is controlled to apply the predetermined voltage to the data line on the transmission device's side in response to the detection information.

(8) The cable according to (1) or (2), in which
the information supply unit applies a predetermined voltage to a data line on the transmission device's side in response to the detection information.

(9) The cable according to (8), in which
detection information from the detection unit is sent to the information supply unit through a predetermined line.

(10) A connection device that connects a transmission device and a reception device to each other,
the connection device including
an element that adjusts signal quality, interposed in a data line;
a detection unit that detects that the reception device is in an operating state; and
an information supply unit that supplies the detection information to the transmission device through a predetermined line.

REFERENCE SIGNS LIST 10-1 to 10-11 Transmission system
130-1 to 130-11 HDMI cable
310 Source device
311 Control unit
312 Voltage monitor unit
320 Sink device
321 EDID ROM
322 Control unit
331A, 331B Conversion circuit
332A, 332B LDO regulator
333B Current drive unit
341, 343, 355, 356 Control unit
342, 344, 345, 353, 354, 357, 358 Switch
351 Voltage monitor unit
352 Dedicated line
361 Current monitor unit
362 Dedicated line
363 Monitor unit

The invention claimed is:

1. A cable connected between a transmission device and a reception device,
the cable comprising:
an element configured to adjust a signal quality, interposed in a data line;
a detection unit configured to detect that the reception device is in an operating state; and
an information supply unit configured to supply detection information to the transmission device through a predetermined line.

2. The cable according to claim 1, wherein the detection unit is further configured to determine that the reception device is in the operating state when a predetermined voltage is applied to the data line on a side of the reception device.

3. The cable according to claim 1, wherein the information supply unit is further configured to output, to a line through which a communication permission signal is supplied to the transmission device, the communication permission signal in response to the detection information.

4. The cable according to claim 3, wherein
the line through which the communication permission signal is supplied is an HPD line.

5. The cable according to claim 4, wherein
the information supply unit is further configured to change a switch provided on the HPD line from off to on in response to the detection information.

6. The cable according to claim 5, further comprising
a data application unit configured to apply a predetermined voltage to a data line on a side of the transmission device.

7. The cable according to claim 6, wherein
the data application unit is controlled to apply the predetermined voltage to the data line on the side of the transmission device in response to the detection information.

8. The cable according to claim 1, wherein the information supply unit is further configured to apply a predetermined voltage to a data line on a side of the transmission device in response to the detection information.

9. The cable according to claim 8, wherein
the detection information from the detection unit is sent to the information supply unit through the predetermined line.

10. A connection device that connects a transmission device and a reception device to each other,
the connection device comprising
an element configured to adjust a signal quality, interposed in a data line;
a detection unit configured to detect that the reception device is in an operating state; and
an information supply unit configured to supply the detection information to the transmission device through a predetermined line.

* * * * *